United States Patent [19]

Hirabayashi et al.

[11] Patent Number: 5,300,790
[45] Date of Patent: Apr. 5, 1994

[54] SEMICONDUCTOR DEVICE

[75] Inventors: Yasuhisa Hirabayashi; Takashi Sakuda; Kazuhiko Okawa; Yasuhiro Oguchi, all of Suwa, Japan

[73] Assignee: Seiko Epson Corporation, Tokyo, Japan

[21] Appl. No.: 71,348

[22] Filed: Jun. 3, 1993

Related U.S. Application Data

[63] Continuation of Ser. No. 829,043, Apr. 15, 1992, abandoned.

[30] Foreign Application Priority Data

Jun. 15, 1990 [JP] Japan .................................. 2-157035
Jun. 15, 1990 [JP] Japan .................................. 2-157036

[51] Int. Cl.$^5$ ..................... H01L 27/02; H01L 27/10; H01L 27/15
[52] U.S. Cl. .................................. 257/202; 257/368; 257/377
[58] Field of Search ..................... 357/41, 45; 257/368, 257/377, 202, 208

[56] References Cited

U.S. PATENT DOCUMENTS

| 4,813,017 | 3/1989 | Wong ................................ 365/156 |
| 4,884,115 | 11/1989 | Petra et al. ......................... 357/42 |
| 5,008,728 | 4/1991 | Yamamura et al. ................ 357/45 |
| 5,015,600 | 5/1991 | Livermore et al. ................. 437/51 |

FOREIGN PATENT DOCUMENTS

| 0280176 | 8/1988 | European Pat. Off. ............. 357/42 |
| 58-87854 | 5/1983 | Japan ................................. 357/45 |
| 60-17930 | 1/1985 | Japan ................................. 357/45 |
| 60-254631 | 12/1985 | Japan ............................... 357/45 |
| 62-229857 | 10/1987 | Japan ............................... 357/45 |
| 63-228641 | 9/1988 | Japan ................................. 357/45 |
| 2-177456 | 7/1990 | Japan ................................. 357/45 |

OTHER PUBLICATIONS

"Gate-Array Cell to Improve Circuit Density on Chips", *IBM Technical Disclosure Bulletin*, vol. 32, No. 5B, Oct. 1989, pp. 277–278.

Primary Examiner—Jerome Jackson
Assistant Examiner—Stephen D. Meier
Attorney, Agent, or Firm—Spensley Horn Jubas & Lubitz

[57] ABSTRACT

Disclosed is a semiconductor device having complementary metal insulator semiconductor field-effect transistors (MISFETs) in which a plurality of basic cells having N-channel MOSs and P-channel MOSs are disposed. In this semiconductor device, a sub MISFET is disposed adjacently to a stopper layer in a region adjacent to other basic cell. An element such as a transmission gate composed of a single element can be actualized by use of the sub-MISFET. In the semiconductor device of this invention, a working efficiency thereof is improved. A response velocity of the P-channel MOS can also be improved using the sub-MISFET. A numerical quantity of the basic cells constituting a circuit can be reduced, resulting in a reduction in parasitic capacity. An operating time of the circuit is thereby decreased.

11 Claims, 7 Drawing Sheets

SEMICONDUCTOR DEVICE

This is a continuation of application Ser. No. 07/829,043 filed on Apr. 15, 1992, now abandoned.

TECHNICAL FIELD

The present invention relates generally to a semiconductor device in which basic cells including a plurality of MISFETs (metal insulator semiconductor field-effect transistors) are continuously formed, and more particularly, to a semiconductor device capable of constructing a CMOS large-scale integrated circuit by a master slice method.

BACKGROUND ARTS

Figure 11:
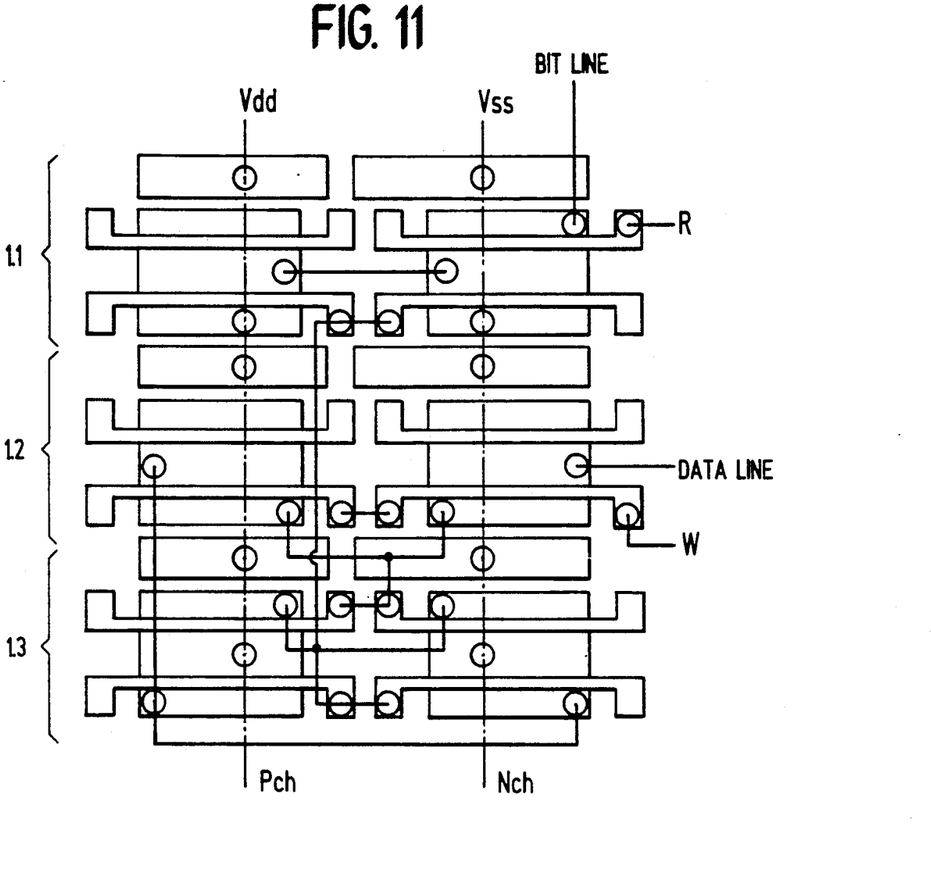
FIG. 11 is a layout diagram showing a configuration of the SRAM using a conventional complementary semiconductor device.

Turning to FIG. 11, there is shown a semiconductor device based on complementary metal-oxide semiconductor (CMOS) field-effect transistors manufactured by a generally employed master slice method. The semiconductor device depicted in this Figure is formed by a gate array method on the basis of cells each consisting of two P-channel MOSs and two N-channel MOSs. A static RAM (SRAM) circuit is constructed by employing the semiconductor device described above.

Figure 12:
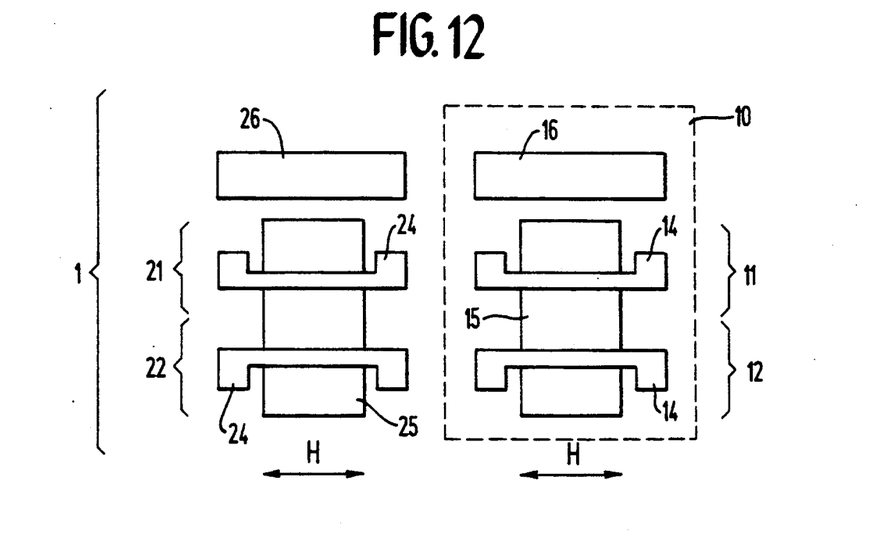
FIG. 12 is a layout diagram showing a configuration of the basic cell shown in FIG. 11.

FIG. 12 illustrates a cell 1 on which this semiconductor device is based. In this cell 1, a high concentration N-type diffused layer is formed by introducing an impurity, wherein a mask is a polysilicon gate 14 formed in a P-type well 10 on the semiconductor device. This high concentration N-type diffused layer 15 and the gate electrode 14 constitute two N-channel MOSs (N-MOSs) 11, 12. The gate electrodes 14 of these two N-MOSs 11, 12 are disposed in parallel and have the same orientation. The MOSs 11, 12 share the N-type diffused layer 15 with each other. This region is therefore used in common as a source or drain region. Further, a stopper layer 16, i.e., a high concentration P-type diffused layer, is formed in parallel with these MOSs 11, 12 in a region adjacent to a cell neighboring to the cell 1. This stopper layer 16 is a diffused layer assuming a substantially rectangular shape. The stopper layer is formed for separating the N-MOSs of the adjacent cells and preventing a channel formation when an inter-cell semiconductor surface is inverted. A power supply line is connected via this stopper layer 16 to a substrate, thereby reducing a difference between a substrate potential and a power supply potential. A latch-up of a parasitic transistor formed in the MOS is prevented.

On the other hand, the cell 1 is formed with two P-channel MOSs (P-MOSs) 21, 22 in symmetry with the N-MOSs 11, 12. In association with the P-MOSs 21, 22, as in the case of the N-MOSs 11, 12, a high concentration P-type diffused layer 25 is formed with a polysilicon gate electrode 24 serving as a mask. Owing to this diffused layer 25 and the gate electrode 24, the two P-MOSs 21, 22 are formed in parallel. As in the case of the N-MOSs 11, 12, the P-MOSs 21, 22 share a source or drain region with each other. In association with these P-MOSs 21, 22, for the same purpose as that of the stopper layer 16, a stopper layer 26 is formed of a high concentration N-type diffused layer.

As described above, one basic cell 1 comprises the two N-MOSs 11, 12, the two P-MOSs 21, 22 and stopper layers 16, 26. In the semiconductor device based on the master slice method, the basic cells are continuously formed at constant intervals. Those basic cells are connected with wires of Al and the like, thus obtaining a desired circuit. The device depicted in FIG. 11 is one example of this arrangement. A SRAM is configured by the gate array method in which designing is effected in conformity with vertical/lateral fixed wiring rules. The following are problems inherent in the conventional complementary semiconductor device in which the P-MOSs and the N-MOSs are continuously formed. Even when a circuit module of a data switch of the above-described SRAM is constructed of unitary elements of N-MOSs, there is no alternative but to use one basic cell in terms of designing the circuit. Taking the wiring rules into consideration, it is difficult to largely change an area of the P-MOS and N-MOS, i.e., a channel width. For this reason, an operating time of the circuit is determined by the P-MOS whose response time is slow.

Figure 3:
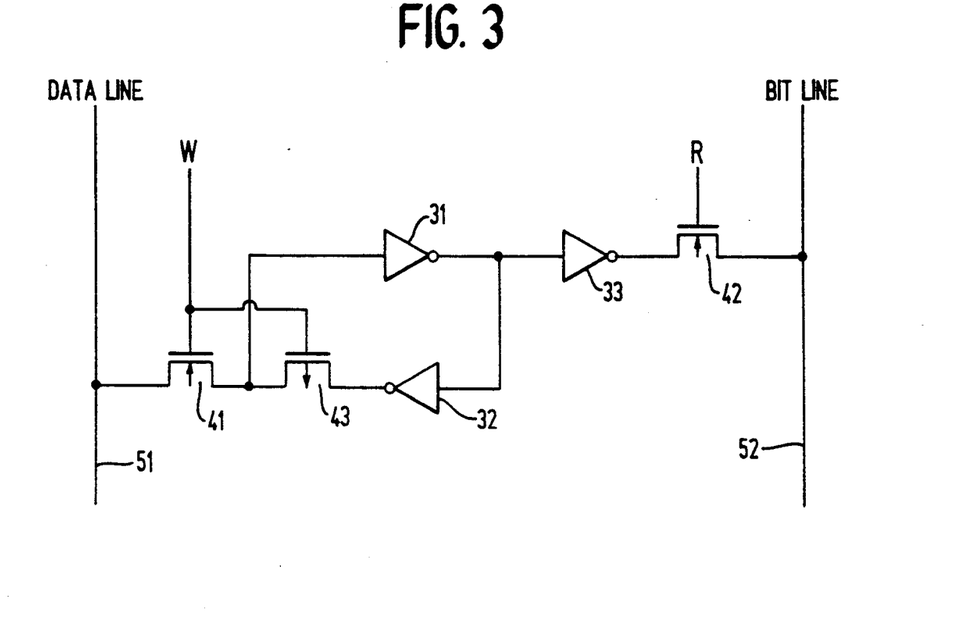
FIG. 3 is a circuit diagram illustrating a logic circuit of the SRAM of FIG. 1.
Figure 4:
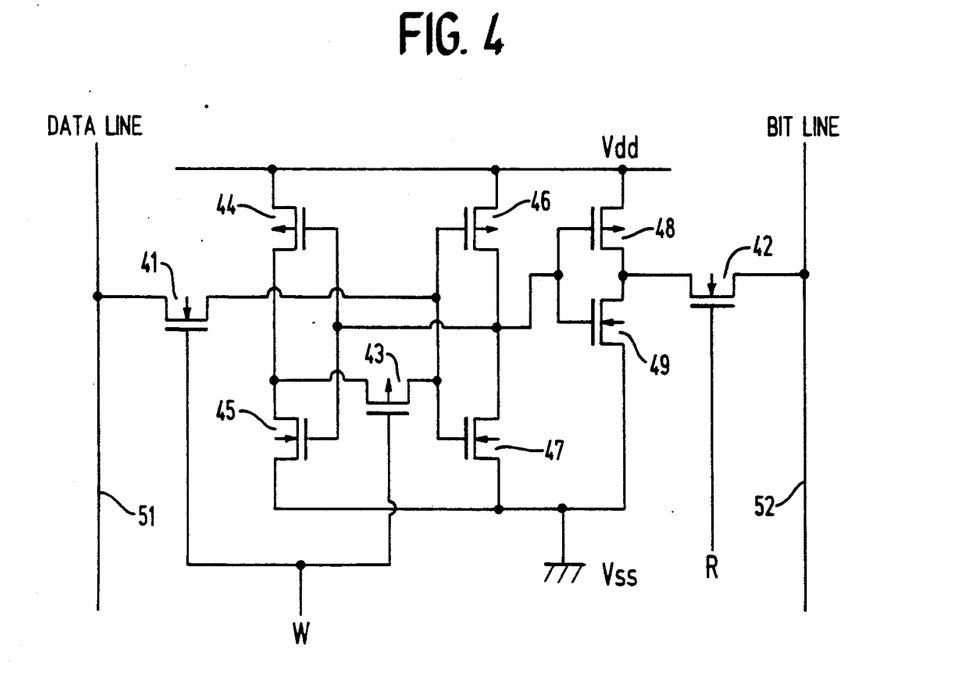
FIG. 4 is a circuit diagram illustrating a circuit of the SRAM of FIG. 1.

FIGS. 3 and 4 show a circuit of the SRAM in this embodiment. The SRAM in this embodiment is a 9-element-based logic circuit in which the N-MOS serves as a transmission gate. The transmission gates provided both on the reading side and on the writing side of this circuit are constructed of N-MOSs 41, 42. If the circuit in which the gates are composed of unitary elements of N-MOSs is configured by the conventional complementary semiconductor device given above, as illustrated in FIG. 11, three pieces of basic cells, viz., an area of 12 elements is required for the 9-element-based circuit.

On the other hand, the following relation about the operating time of the semiconductor device is established:

$$tr = 4 \times C/(\beta \times H \times Vdd) \qquad (1)$$

where tr is the response time indicating a rise or decay time of the MOS, C is the load capacity indicating a capacity of the MOS itself and a capacity of wires parasitic to the MOS, H is the channel width, Vdd is the power supply potential, and $\beta$ is the current amplification rate per unit length of the MOS. The current amplification rate of the P-MOS is approximately a half or a third the current amplification rate of the N-MOS. Namely, if the channel widths H are substantially equal, the response time tr of the P-MOS is approximately twice or three times as large as that of the N-MOS. For instance, in the conventional complementary semiconductor device, an inverter is composed of the P-MOS and the N-MOS. In this case, because of the channel widths H being equal, a rise time of this inverter is required to be approximately twice or three times the decay time. Hence, in the circuit where a plurality of inverters are connected, the operating time of the device is conditioned by the response time of the P-MOSs.

In the light of such problems, the present invention aims at improving a working efficiency of a semiconductor device by ameliorating a layout of the semiconductor device based on a master slice method in which P-MOSs and N-MOSs are continuously formed and reducing an area occupied by a circuit. It is an object of the present invention to attain a semiconductor device capable of an operating time of a MOS logic circuit by restraining an increase in the area occupied by the circuit.

DISCLOSURE OF THE INVENTION

A complementary semiconductor device based on a master slice method includes a plurality of basic cells continuously disposed. This basic cell consists of a single or a plurality of metal insulator semiconductor field-effect transistors (MISFETs) and a stopper layer for separating these MISFETs from MISFETs of an adjacent basic cell. The basic cells are continuously arranged so that the MISFETs and the stopper layers are parallel with each other. In such a semiconductor device, a small-sized MISFET can be formed adjacently to the stopper layer in a region neighboring to the basic cell in which the stopper layer is formed. More specifically, in addition to the stopper layer, a sub-MISFET having an area smaller than that of the MISFETs constituting the basic cell in a region neighboring to the basic cell which has hitherto been occupied by the stopper layer.

The sub-MISFET may be formed in parallel with a first conductive type MISFET through a first conductive type diffused layer. The sub-MISFET may be also formed in parallel with a second conductive type MISFET through a second conductive type diffused layer. Besides, the sub-MISFETs of the respective conductive types may be also formed in parallel with the first conductive type MISFET and the second conductive type MISFET, respectively.

Where the channel regions are so oriented as to equalize the forming direction of the sub-MISFETs and the direction of the MISFETs constituting the basic cell, the wire design with respect to the sub-MISFETS can be effected by the gate array method. Those sub-MISFETs may be formed in continuation from the MISFETs constituting the basic cell by use of the same diffused layer. This diffused layer may be employed as a source or drain region common to the MISFETs and the sub-MISFET.

In the semiconductor device including the basic cell having the sub-MISFET according to the present invention, a circuit element of unitary elements can be configured by use of this sub-MISFET. Actualized, for example, is a circuit including a transmission gate constructed of a single piece of second conductive type MISFET by using the semiconductor device, formed with the second conductive type sub-MISFET, of this invention. In this case, the transmission gate is composed of the sub-MISFET, whereby a numerical quantity of the basic cells occupied by the circuit can be reduced. Therefore, unlike the conventional complementary semiconductor device, it is unnecessary to occupy the basic cells including the MISFETs of two conductive types for the circuit element actualized by the single element. For this reason, a working efficiency of the semiconductor device can be improved. Moreover, the numerical quantity of the basic cells constituting one circuit can be reduced, with the result that a length of wires for connecting the respective MISFETs can be shortened. This in turn decreases a capacity of wires parasitic to the MISFETs. The load capacity expressed by the formula (1) can be decreased. It is therefore possible to reduce the operating time of the circuit by configuring the circuit by use of the semiconductor device of this invention.

On the other hand, where a logic circuit is constructed by using the semiconductor device, formed with the first conductive type sub-MISFET, of the present invention, the operating time of the circuit can be largely decreased. To be specific, the first conductive type sub-MISFET is connected in parallel to the first conductive type MISFET, an apparent channel width can be expanded. For this reason, as expressed in the formula (1), the response time of the first conductive type one can be approximate to that of the second conductive type one. Hence, the operating time of the logic circuit configured by use of the semiconductor device of this invention can be reduced.

BEST MODE FOR CARRYING OUT THE INVENTION

Preferred embodiments of a semiconductor device according to the present invention will hereinafter be described with reference to the accompanying drawings.

EMBODIMENT 1

Figure 1:
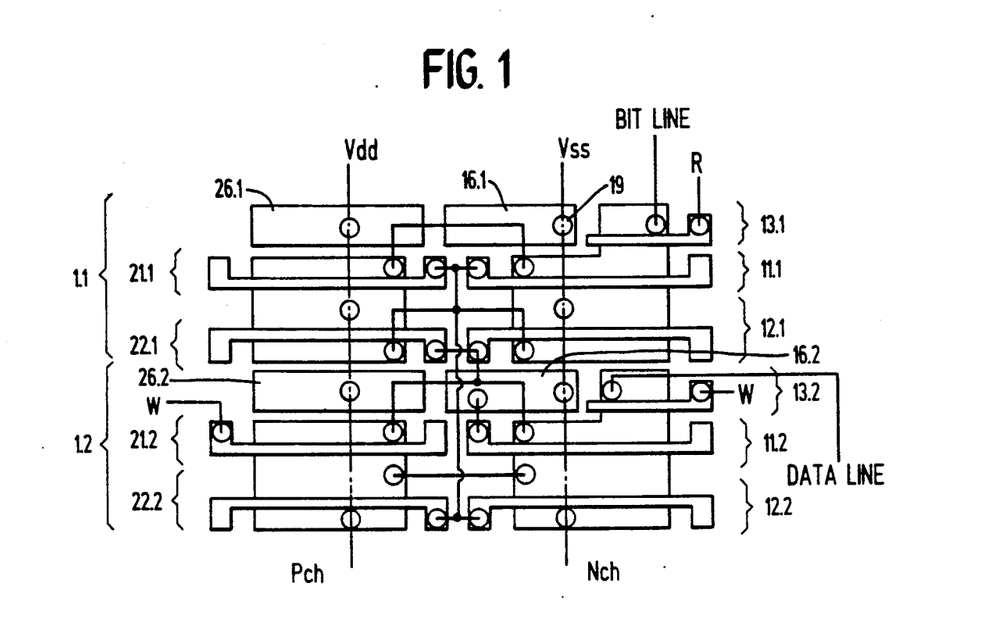
FIG. 1 is a layout diagram showing a construction of an SRAM using a semiconductor device including an N-channel sub-MOS in an embodiment 1 of the present invention.

FIG. 1 illustrates a layout of an SRAM using a semiconductor device formed with an N-channel sub-MOS in an embodiment 1 of the present invention. In this embodiment, among basic cells formed in the semiconductor device, two basic cells 1.1, 1.2 constitute one memory circuit of the SRAM.

Figure 2:
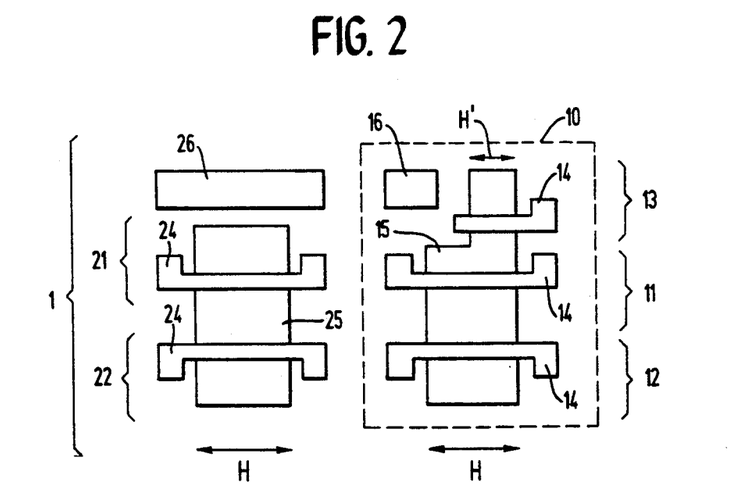
FIG. 2 is a layout diagram showing a configuration of a basic cell of the semiconductor device illustrated in FIG. 1.

FIG. 2 shows a configuration of the basic cell constituting the semiconductor device depicted in FIG. 1. A basic cell 1 includes a P-type well 10 formed with two N-channel MOSs (N-MOSs) 11, 12. A stopper layer 16 composed of a high-concentration P-type diffused layer is formed in parallel therewith. A sub-MOS 13 is formed on the opposite side to P-channel MOS (P-MOSs) 21, 22 which will be mentioned later, with this stopper layer 16 being interposed therebetween. This sub-MOS 13 is an N-channel MOS composed of a high concentration N-type diffused layer 15 which is, as in the case of the N-MOSs 11, 12, introduced with a polysilicon gate electrode 14 serving as a mask. The sub-MOS 13 is formed in parallel with the N-MOSs 11, 12. The N-type diffused layer 15 used as a source or drain of this sub-MOS 13 is identical with an N-type diffused layer 15 for constituting the N-MOS 11 described above. A region of this N-type diffused layer 15 can be therefore used in common to the sub-MOS 13 as a region of the source or drain of the N-MOS 11. This sub-MOS 13 is formed in line with the stopper layer 16 in a region, adjacent to other basic cell, of the basic cell 1. Hence, a channel width H' of the sub-MOS 13 is approximately a half the channel width H of the N-MOSs 11, 12 which constitute the basic cell 11. As discussed above, in the device in this embodiment, the sub-MOS is incorporated into the basic cell without increasing the area of the basic cell over that of the conventional semiconductor device shown in FIG. 12.

On the other hand, two pieces of P-MOSs 21, 22 constituting the basic cell in this embodiment are, as in the case of the conventional complementary type basic cell, formed in symmetry with the two N-MOSs 11, 12. Further, a stopper layer 26 for separating the P-MOSs 21, 22 from the adjacent basic cell is also formed as in the same way with the conventional basic cell. These components are marked with the same numerals because of being identical with the conventional ones, and the description will be omitted.

As explained above, the conventional basic cell comprises two pieces of N-MOSs 11, 12, two pieces of P-MOSs 21, 22 and stopper layers 16, 26. In the semiconductor device in this embodiment, one N-channel sub-MOS 13 is added to those components to configure the basic cell 1. With this arrangement, a circuit element such as a transmission gate composed of a unitary element of N-MOS can be formed by using the sub-MOS 13.

FIGS. 3 and 4 show a circuit of the SRAM illustrated in FIG. 1. The SRAM in this embodiment is conceived as a 9-element-based memory circuit in which the N-MOS is employed as a transmission gate. In this circuit, a transmission gate 41 is at first opened based on a write enable signal W. A signal from a data line 51 is applied to an inverter 31 consisting of a P-MOS 46 and an N-MOS 47. A signal amplified by this inverter 31 is then applied to an inverter 32 constructed of a P-MOS 44 and an N-MOS 45. When the write enable signal W is turned OFF, the transmission gate composed of the N-MOS is closed, whereas a transmission gate 43 composed of a P-MOS is opened. For this reason, the signal amplified by the inverter 32 through this transmission gate 43 is applied again to the inverter 31. The information is recorded by the inverters 31, 32.

Next, when a transmission gate consisting of an N-MOS is opened in response to a read enable signal R, the information held by the inverters 31, 32 is amplified by an inverter 33 constructed of a P-MOS 48 and an N-MOS 49 and appears in a bit line 52.

In the semiconductor device in this embodiment for actualizing this circuit, the basic cells 1 shown in FIG. 2 are continuously formed vertically and laterally. These basic cells are connected through internal wiring to obtain a desired circuit. The above-mentioned circuit is, as illustrated in FIG. 1, attained with the two basic cells 1.1, 1.2. A design of internal wiring involves the use of a gate array method having a design rule in which the wires are orthogonal. At the first onset, power supply wires are arranged orthogonally to the respective MOSs. Vdd is connected to the P-MOSs, while Vss is connected to the N-MOSs. The respective power supply wires are connected through viaholes 19 to stopper layers 16.1, 16.2, 26.1, 26.2 for preventing a latch-up by a transistor parasitic to the MOS, with a drop of substrate potential.

The wires are connected to the respective MOSs contained in these cells 1.1, 1.2 to configure the SRAM. To start with, a read transmission gate 42 is formed of an N-channel sub-MOS 13.1 of the cell 1.1. Next, a P-MOS 21.1 and an N-MOS 11.1 are combined to constitute the inverter 33. A P-MOS 22.1 and an N-MOS 12.1 cooperate to constitute the inverter 31. In the cell 1.2, a write transmission gate 41 is composed of a sub-MOS 13.2. A storage holding transmission gate 43 is constructed of a P-MOS 21.2. A P-MOS 22.2 and an N-MOS 12.2 are combined to constitute the inverter 32. A gate electrode of the N-MOS 11.2 of this cell is connected via the stopper layer 16.2 to a power supply Vss to separate the sub-MOS 13.2 used for the transmission gate 41 from the N-MOS 12.2 used for the inverter 32.

As explained above, the SRAM can be attained with two basic cells by use of the semiconductor device having the sub-MOSs in this embodiment. To configure such a circuit, in the conventional semiconductor device, as illustrated in FIG. 11, three pieces of cells are needed. Based on the device in this embodiment, however, as depicted in FIG. 1, the write transmission gate 41 is constructed of the sub-MOS 13.2 of one cell 1.2, while the read transmission gate 42 is constructed of the sub-MOS 13.1 of the other cell 1.1. Therefore, the 9-element-based memory circuit can be composed of the two cells.

In the circuit formed in the device in this embodiment, the N-channel MOSs are adopted for the transmission gates 41, 42. A rise time thereof is relatively short. Hence, an influence on a working time of the circuit is small even when those transmission gates 41, 42 are constructed of the sub-MOSs 13.1, 13.2 having a narrow channel width. The conventional device requires three pieces of cells for configuring the circuit in this embodiment. In a comparison with the conventional device, a wiring capacity associated with MOSs is reduced, and a parasitic capacity is also decreased in the device according to this embodiment. An operating time of the circuit is, it can be said, decreased.

The circuit can be constructed by the cells whose number is two thirds that of the conventional semiconductor device. A working efficiency of the semiconductor device is, as a matter of course, improved. For this reason, the IC for memory can be miniaturized by employing the device in this embodiment, and a degree of integration can be also increased.

EMBODIMENT 2

Figure 5:
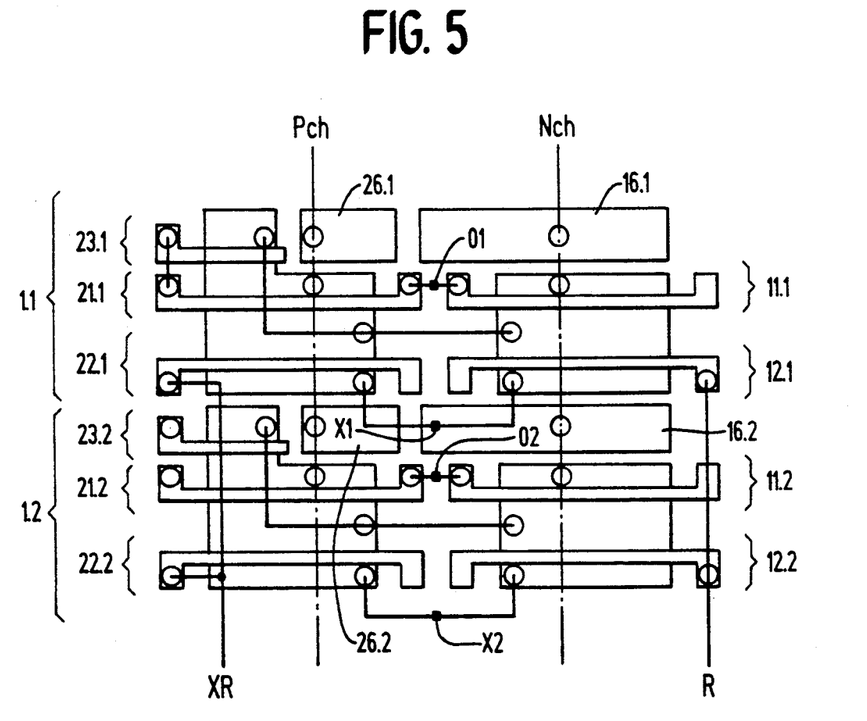
FIG. 5 is a layout diagram showing a configuration of an output multiplexer employing the semiconductor device including a P-channel sub-MOS in an embodiment 2 of this invention.

FIG. 5 illustrates the semiconductor device in this embodiment, wherein P-channel sub-MOSs relative to an embodiment 2 are formed. The circuit shown in this embodiment is 2-output multiplexer. In the semiconductor device according to this embodiment, P-channel sub-MOSs 23.1, 23.2 are, in sharp contrast with the embodiment 1, formed adjacently to stopper layers 26.1, 26.2 on the side of the P-MOS. Other basic cell configurations are the same as those in the embodiment 1, and the description will be omitted while they are marked with the like numerals. The arrangement that those basic cells are continuously formed in the semiconductor device according to this embodiment is the same with the embodiment 1.

Figure 6:
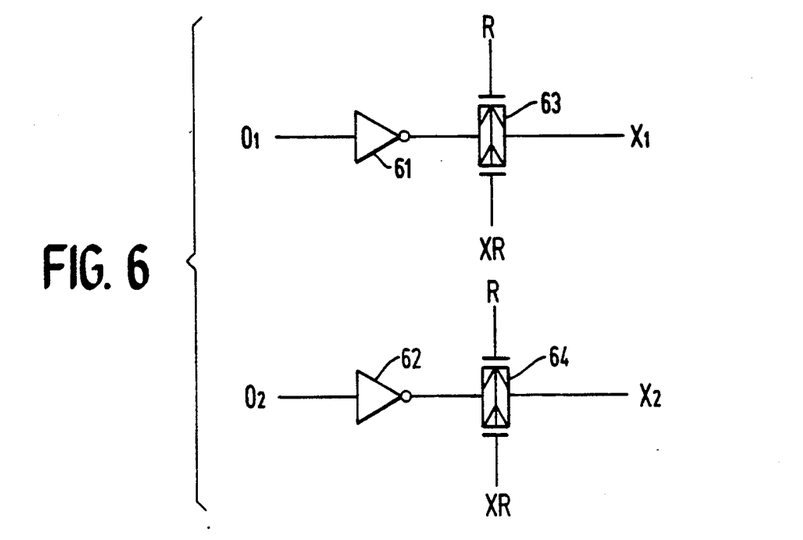
FIG. 6 is a circuit diagram illustrating a logic circuit of the output multiplexer shown in FIG. 1.
Figure 7:
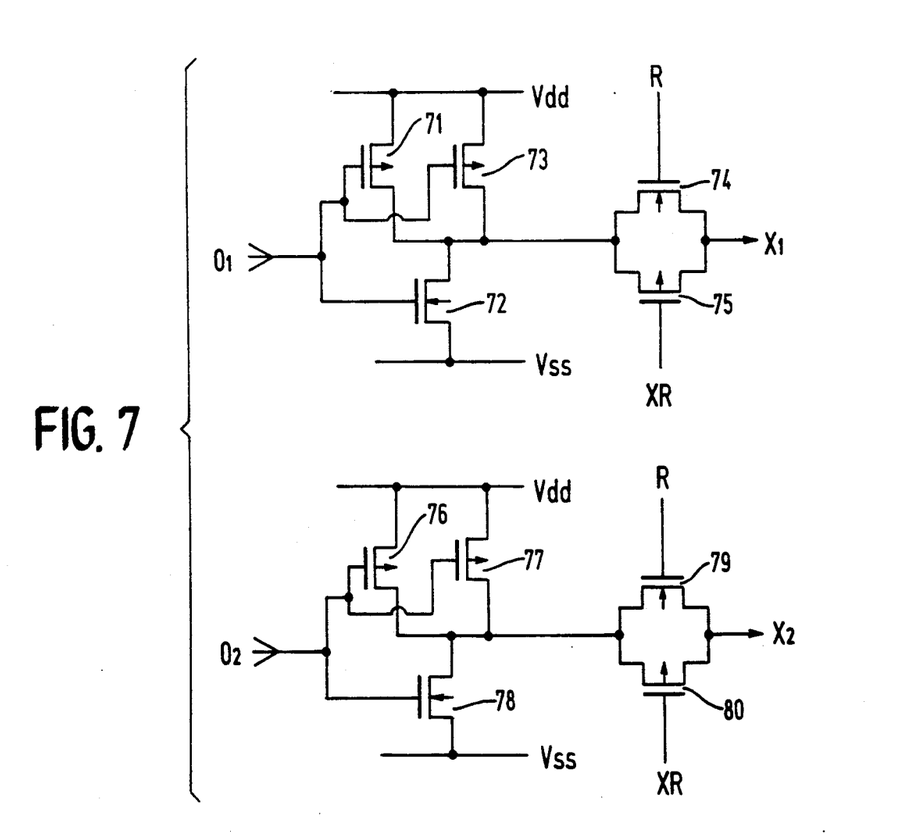
FIG. 7 is a circuit diagram illustrating a circuit of the output multiplexer shown in FIG. 1.

Turning to FIGS. 6 and 7, there is illustrated a circuit configured in the device in this embodiment. This circuit conceived as a 2-output multiplexer consists of:

inverters 61, 62 for amplifying the outputs and transmission gates 63, 64 opened and closed by the read enable signal R and an inverted signal XR thereof. In this circuit, when the transmission gate 63 is opened by the read enable signal R and the inverted signal XR thereof, an output 01 is amplified by the inverter 61. As a result, an output signal X1 appears on the output side. The situation is the same with relations between an output 02 and an output signal X2 and between a transmission gate 64 and an inverter 62.

In the circuit described above, a signal rise time is conditioned by a response time of the P-MOS constituting the inverter. In general, the response time of the P-MOS is, as discussed above, two or three times that of the N-MOS. A reduction in the operating time of this circuit requires a decrease in the response time of the P-MOS. In this situation, the conventional semiconductor device takes such a countermeasure that two pieces of P-MOSs are connected in parallel. Hence, only one inverter is constructed of the basic cell including the P-MOSs and the N-MOSs by twos as the case may be.

In the device according to this embodiment, as illustrated in FIG. 7, the response time of the P-MOS is improved by connecting a P-channel sub-MOS 73 to a P-MOS 71 in parallel. With this arrangement, the inverter and the transmission gate can be composed of one cell, thereby making it possible to improve the working efficiency of the semiconductor device.

Circuitry in this embodiment will be explained referring to FIG. 7. An inverter 61 consists of the P-MOS 71, the sub-MOS 73A and the N-MOS 72 which are connected in parallel. A transmission gate 63 is constructed of an N-MOS 74 and a P-MOS 75. Similarly, an inverter 62 consists of a P-MOS 76, a sub-MOS 77 and an N-MOS 78. An N-MOS 79 and a P-MOS 80 are combined to constitute a transmission gate 64.

In the semiconductor device according to this embodiment, this circuit is, as depicted in FIG. 5, composed of two basic cells 1.1, 1.2. According to this embodiment also, as in the same way with the embodiment 1, wiring is effected using the gate array. The power supply wires Vdd and Vss are, as in the embodiment 1, connected to the stopper layers 16.1, 16.2, 26.1, 26.2. In connection with wiring of the basic cell 1.1, gate electrodes thereof are connected so that a sub-MOS 23.1 is parallel with a P-MOS 21.1. Drains of these MOSs are connected to a drain of the N-MOS 11.1, thus constituting the inverter 61. The transmission gate 63 is composed of the P-MOS 22.1 whose source region is a drain region of the P-MOS 21.1 and the N-MOS 12.1 whose source region is a drain region of the N-MOS 11.1. In the thus configured cell, the output 01 is applied to the gate electrodes of the N-MOS 11.1 and of the P-MOS 21.1. Output signals X1 are fetched from the drains of the N-MOS 12.1 and the P-MOS 22.1, whereby a multiplexer is constructed.

The same wire arrangement with the cell 11.1 is applied to two P-MOSs 21.2, 22.2, two N-MOSs 11.2, 12.2 and further a sub-MOS 23.2 which are formed in the cell 1.2. A multiplexer is thus configured.

As discussed above, in the semiconductor device according to this embodiment, the inverter and the transmission gate can be constructed of one cell. Simultaneously, the operating time of the inverter can be reduced by use of the sub-MOSs. Therefore, the operating time can be decreased with no decrease in the working efficiency of the semiconductor device. Besides, the conventional semiconductor device involves the use of a multiplicity of basic cells to reduce the operating time, resulting in an increase in the parasitic capacity of wires for connecting the basic cells. No sufficient time reduction was given therein. Where the circuit is constituted by use of the semiconductor device in this embodiment, however, the number of basic cells does not increase, and there is caused a less amount of influence on the operating time due to an increase in the parasitic capacity of wires. A driving capability of the P-channel MOS in this circuit is enhanced, whereby a balance of logic level can be kept. AC and Dc characteristics are also ameliorated.

EMBODIMENT 3

Figure 8:
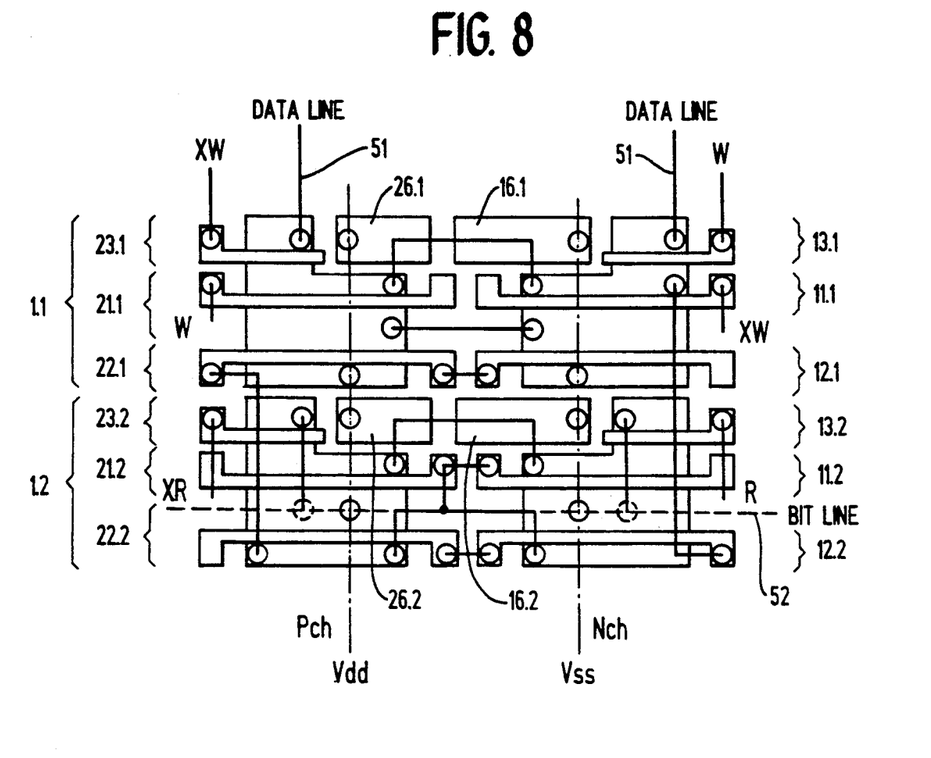
FIG. 8 is a layout diagram showing a configuration of the SRAM using the semiconductor device including the N-and-P channel sub-MOSs in a third embodiment of this invention.

FIG. 8 illustrates the semiconductor device in this embodiment, wherein one cell includes an N-channel sub-MOS and a P-channel sub-MOS. A circuit constructed in the device according to this embodiment is the SRAM identical with that of the embodiment 1. In this embodiment, transmission gates 41, 42, 43 are constructed of the N-channel MOSs and the P-channel MOSs.

Figure 9:
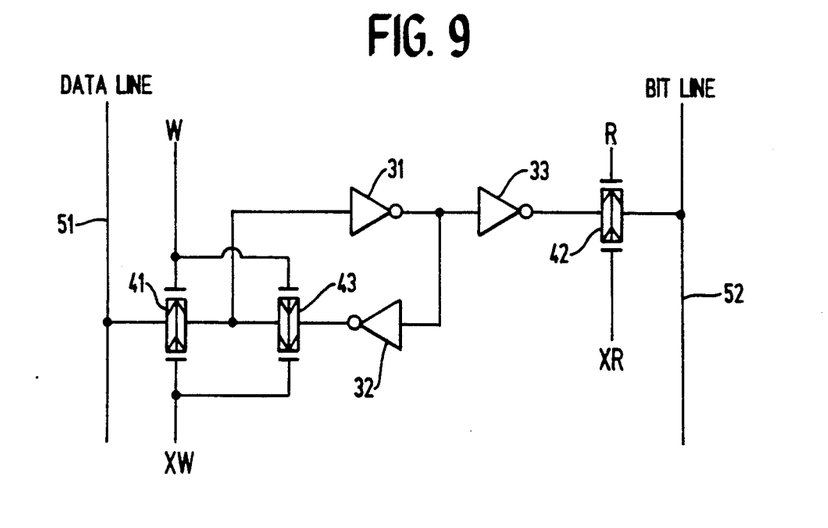
FIG. 9 is a circuit diagram depicting a logic circuit of the SRAM shown in FIG. 8.

The circuit of this embodiment is demonstrated by FIG. 9. The write transmission gate used for the circuit in this embodiment is opened and closed based on a write enable signal W and an inverted signal XW thereof. The read transmission gate is opened and closed based on a read enable signal R and an inverted signal XR thereof. Operations of the inverters 31, 32, 33 and others are the same as those in the embodiment 1, and hence the description thereof is omitted while the components are marked with the like numerals.

In the semiconductor device according to this embodiment, the circuit described above is constructed of two basic cells 1.1, 1.2. More specifically, the transmission gate 41 consists of the P-channel sub-MOS 23.1 and the N-channel sub-MOS 13.1. The transmission gate 43 consists of the N-MOS 11.1 and the P-MOS 21.1. The inverter 32 is composed of the P-MOS 22.1 and the N-MOS 12.1. In the cell 1.2, the P-channel sub-MOS 23.2 and the N-channel sub-MOS 13.2 are combined to constitute the read transmission gate 42. The inverter 33 is constructed of the P-MOS 21.2 and the N-MOS 11.2. The inverter 31 is constructed of the P-MOS 22.2 and the N-MOS 12.2. An output of the transmission gate 42 is connected to a bit line 52.

Such a 12-element-based circuit has hitherto been configured by use of three pieces of cells in the conventional semiconductor device wherein the basic cell is composed of two N-MOSs and two P-MOSs. The 12-element-based circuit composed of two basic cells each having the same area is, however, attainable with the semiconductor device according to this embodiment. An integration rate of the semiconductor device can be therefore improved, and at the same moment an operating velocity can be also ameliorated by reducing the parasitic capacity of wires.

Figure 10:
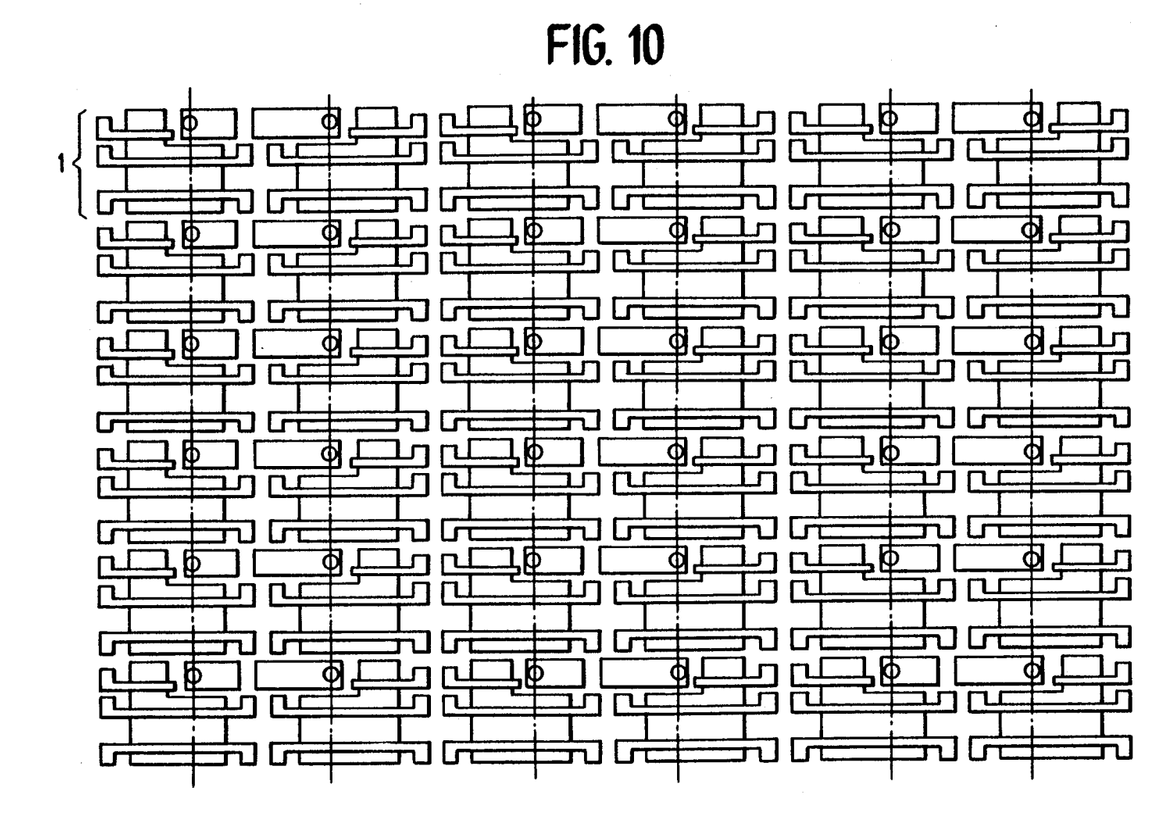
FIG. 10 is a layout diagram showing a construction of the semiconductor device of this invention of FIG. 8.

FIG. 10 depicts the semiconductor device in this embodiment, wherein the basic cells 1 are continuously formed. As described above, in the semiconductor device according to this embodiment, the basic cells 1 are consecutively formed vertically and laterally by the master slice method. A multiplicity of memory circuits are configured by inter-cell connections with the wires, thereby obtaining a single integrated circuit.

Note that the embodiments discussed above present an example where all the sub-MOSs are disposed outwardly of the basic cell, i.e., with the stopper layer being interposed therebetween. Contrary to this example, however, one conductive sub-MOS may, as a matter of course, be disposed inwardly of the basic cell, while the other conductive sub-MOS may be disposed outwardly of the basic cell.

INDUSTRIAL APPLICABILITY

Employed is, as discussed above, the semiconductor device including the basic cell formed with the sub-MISFETs according to the present invention. The integration rate can be improved by enhancing the working efficiency of the semiconductor device. Besides, the operating time can be also reduced. Hence, it is possible to actualize a small-sized and high-speed I/O unit as well as the memory element having a high degree of integration by using the device in the present embodiment.

What is claimed is:

1. A semiconductor device comprising:
   a plurality of basic cells formed on a substrate and disposed adjacent to one another, the cells being configurable into a predetermined circuit by intra basic cell connections and inter basic cell connections, wherein:
   each of said basic cells occupies a region of said substrate, which region is enclosed by first and second lines extending parallel to one another in a first direction, said basic cells being disposed adjacent one another and being spaced apart from one another in the first direction;
   each of said basic cells comprises a first plurality of main MISFETs of a first conductivity type disposed in parallel with one another, a second plurality of main MISFETs of a second conductivity type opposite to the first conductivity type disposed in parallel with one another, said first plurality of main MISFETs occupying a first portion of the region and said second plurality of main MISFETS occupying a second portion of the region, said first and second portions being separated from one another in a second direction which is perpendicular to the first direction, said first portion being disposed adjacent said first line and said second portion being disposed adjacent said second line, and a stopper layer disposed in parallel with said main MISFETs;
   each of said basic cells further comprises a sub-MISFET having an area smaller than the area of each said main MISFET of said basic cell and formed in said first portion of the region of said basic cell;
   in each of said basic cells, said stopper layer is disposed at least partially in said first portion and extends in the second direction from said sub-MISFET toward said second portion so that said sub-MISFET is located between said stopped layer and said first line; and
   in each of said basic cells, each said main MISFET and said sub-MISFET has a respective gate electrode having a connection end and said connection ends of said gate electrodes of said first plurality of main MISFETs and said sub-MISFET are aligned with one another in the first direction and extend along said first line.

2. The semiconductor device as set forth in claim 1 wherein said stopper layer is of the second conductivity type.

3. The semiconductor device as set forth in claim 2 wherein said gate electrodes of said MISFETs in each of said basic cells are elongate gate electrodes and all of said gate electrodes extend in parallel with one another.

4. The semiconductor device as set forth in claim 3 wherein all of said gate electrodes extend in the second direction.

5. The semiconductor device as set forth in claim 2 wherein each said MISFET has a source and a drain and each of said basic cells has a first impurity doped subregion which constitutes the source or drain of two of said main MISFETs.

6. The semiconductor device as set forth in claim 5 wherein said each of said basic cells has a second impurity doped subregion which constitutes the source or drain of one of said main MISFETs and the source or drain of said sub-MISFET.

7. The semiconductor device as set forth in claim 2 wherein, in said each of said basic cells, each said MISFET has a channel width and the channel width of said sub-MISFET is smaller than the channel width of each said main MISFET.

8. The semiconductor device as set forth in claim 1 wherein each said MISFET has a source and a drain and each of said basic cells has a first impurity doped subregion which constitutes the source or drain of two of said main MISFETs.

9. The semiconductor device as set forth in claim 8 wherein said each of said basic cells has a second impurity doped subregion which constitutes the source or drain of one of said main MISFETs and the source or drain of said sub-MISFET.

10. The semiconductor device as set forth in claim 1 wherein each of said basic cells further comprises:
    a second sub-MISFET having an area smaller than the area of each said main MISFET and formed in said second portion of the region of said basic cell; and
    a second stopper layer disposed at least partially in said second portion and extending in the second direction from said second sub-MISFET toward said first portion so that said second sub-MISFET is located between said second stopper layer and said second line.

11. The semiconductor device as set forth in claim 10 wherein, in each of said basic cells:
    said second sub-MISFET has a gate electrode having a connection end and said connection ends of said gate electrodes of said second plurality of main MISFETs and said sub-MISFET are aligned with one another in the first direction and extend along said second line.

* * * * *